(12) United States Patent
Zhao et al.

(10) Patent No.: US 10,985,341 B2
(45) Date of Patent: Apr. 20, 2021

(54) ENCAPSULATING THIN FILM, PRODUCTION METHOD THEREOF, AND METHOD FOR ENCAPSULATING DISPLAY PANEL

(71) Applicants: BOE Technology Group Co., Ltd., Beijing (CN); Hefei Xinsheng Optoelectronics Technology Co., Ltd., Anhui (CN)

(72) Inventors: Lihao Zhao, Beijing (CN); Tianfeng Pan, Beijing (CN); Tao Jin, Beijing (CN); Biao Tian, Beijing (CN); Jieshu Wu, Beijing (CN); Jianhui Zhang, Beijing (CN); Yong Cui, Beijing (CN); Yang Xu, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 154 days.

(21) Appl. No.: 15/993,073

(22) Filed: May 30, 2018

(65) Prior Publication Data

US 2019/0165307 A1    May 30, 2019

(30) Foreign Application Priority Data

Nov. 27, 2017 (CN) .......................... 201711206171.X (51) Int. Cl.
*H01L 51/52* (2006.01)
*H01L 51/56* (2006.01)

(52) U.S. Cl.
CPC .......... *H01L 51/5243* (2013.01); *H01L 51/56* (2013.01); *H01L 2251/301* (2013.01); *H01L 2251/566* (2013.01)

(58) Field of Classification Search
CPC ................................................. H01L 51/4243
See application file for complete search history.

(56) References Cited

U.S. PATENT DOCUMENTS

2011/0315977 A1* 12/2011 Murayama ............ H01L 51/448
257/40
2017/0222182 A1* 8/2017 Mo ........................ H01L 51/524

FOREIGN PATENT DOCUMENTS

WO    WO-2019082359 A1 *  5/2019 ............. H05B 33/02

OTHER PUBLICATIONS

Machine translation WO 2019082359A1 (Year: 2019).*

* cited by examiner

*Primary Examiner* — Alexandre F Ferre
(74) *Attorney, Agent, or Firm* — Westman, Champlin & Koehler, P.A.

(57) ABSTRACT

Provided are an encapsulating thin film, a production method thereof, and a method for encapsulating a display panel. The encapsulating thin film has: a protective film; a plurality of discrete metal film units on the protective film; an adhesive layer on each of the metal film units; and optionally a release layer. This encapsulating thin film may be used to encapsulate a plurality of display panels simultaneously.

14 Claims, 5 Drawing Sheets

ENCAPSULATING THIN FILM, PRODUCTION METHOD THEREOF, AND METHOD FOR ENCAPSULATING DISPLAY PANEL

CROSS-REFERENCE TO RELATED APPLICATION

This disclosure claims the priority of Chinese Patent Application No. 201711206171.X filed on Nov. 27, 2017, which is incorporated herein by reference in its entirety.

TECHNICAL FIELD

This disclosure relates to the technical field of display panels, and particularly to an encapsulating thin film, a production method thereof, and a method for encapsulating a display panel.

BACKGROUND ART

Organic electroluminescent devices (OLEDs) are a new lighting and display technique, and have been more and more widely used due to their unique advantages. A metal encapsulation technique may be used in the process of large-size OLED panel encapsulation. By adhering a metal cover plate or thin film having a corresponding size on a single display device, a single display panel is obtained.

As for the metal encapsulation technique, the requirements for improvements still exist.

SUMMARY OF THE INVENTION

In one aspect, this disclosure provides an encapsulating thin film, comprising:
a protective film;
a plurality of discrete metal film units on the protective film; and
an adhesive layer on each of the metal film units.
Optionally, the encapsulating thin film further comprises:
a peelable release film on the adhesive layer.
Optionally, the material of the metal film unit is an invar film, a NiFe alloy, SUS stainless steel, or one or more materials of Ni, Fe, and Co.
Optionally, the protective film comprises a base material layer and a colloid layer.
Optionally, the base material layer is selected from any one of polypropylene terephthalate, polypropylene, polyethylene, oriented polypropylene, and polyvinyl chloride, and the colloid layer is selected from any one of acrylate, silica gel, polyurethane, and rubber.
Optionally, the adhesion between the protective film and the metal film unit is 5 g/25 mm or more.
Optionally, the metal film unit has a larger area compared to the adhesive layer thereon.
Optionally, the adhesive is selected from any one of polyvinyl acetate, polyvinyl alcohol, polyvinyl formal, polypropylene, polyethylene, polyvinyl chloride, polyurethane, polyamide, saturated polyester, urea resin, phenolic resin, resorcinol resin, melamine resin, epoxy resin, unsaturated polyester, polyisocyanate, and furan resin, and has a thickness of 30-80 μm.
Optionally, the material of the release film is selected from any one of polypropylene terephthalate, polypropylene, polyethylene, oriented polypropylene, and polyvinyl chloride.
Optionally, the encapsulating thin film is a coiled material.

In another aspect, this disclosure provides a production method of the encapsulating thin film described above, comprising:
providing a metal film having a first surface and a second surface, which are opposite;
bonding the protective film to the first surface of the metal film;
forming the plurality of discrete metal film units by using a patterning process at the second surface of the metal film; and
applying the adhesive layer onto the metal film unit.
Optionally, the production method further comprises attaching a release film on the adhesive layer.
Optionally, the patterning process comprises:
coating a photoresist on the second surface of the metal film;
subjecting the photoresist to exposure and development to expose the metal film between the metal film units; and
etching the exposed metal film to form the plurality of discrete metal film units.
Optionally, the method further comprises:
forming an alignment mark in the metal film by the patterning process.

In still another aspect, this disclosure provides a method for encapsulating a display panel by using the encapsulating thin film described above, comprising:
providing an array of a plurality of display panels to be encapsulated;
providing the encapsulating thin film described above, wherein an array of the plurality of discrete metal film units corresponds to the array of the plurality of display panels to be encapsulated;
aligning the plurality of discrete metal film units with the plurality of display panels to be encapsulated, respectively;
adhering the plurality of discrete metal film units to the plurality of display panels to be encapsulated by the adhesive layer, respectively, to encapsulate the plurality of display panels to be encapsulated.
Optionally, the array of the plurality of display panels to be encapsulated is formed on a motherboard, and the method further comprises:
separating the plurality of display panels to be encapsulated from the motherboard after encapsulating the plurality of display panels to be encapsulated, to obtain a plurality of display panels.

DESCRIPTION OF DRAWINGS

In order to illustrate the technical solutions in embodiments of this disclosure more clearly, figures required for describing the embodiments of this disclosure will be simply introduced below. It is apparent that the figures described below are merely some embodiments of this disclosure, and other figures may be further obtained by those of ordinary skill in the art according to these figures without exerting inventive work.

DESCRIPTION OF EMBODIMENTS

In order to enable objects, features, and advantages of this disclosure described above to be more remarkably and easily understood, this disclosure will be further illustrated in detail below in conjunction with accompanying drawings and specific embodiments.

A metal encapsulation mode may be used in the process of large-size OLED panel encapsulation. However, if a large sheet of metal film is directly attached to a substrate comprising a plurality of panels to be encapsulated, it will result in failure of cutting in subsequent processes. Therefore, at present, metal encapsulation is often performed in a manner of encapsulating each panel individually. This results in that a single apparatus fails to correspond to panels having various sizes. Furthermore, a single apparatus fails to attach a plurality of panels simultaneously. There are problems of excessively high investment cost of apparatuses and low production efficiency.

This disclosure provides an encapsulating thin film, a production method thereof, and a method for encapsulating a display panel, so as to improve the production efficiency while reduce the investment cost of apparatuses.

Figure 9:
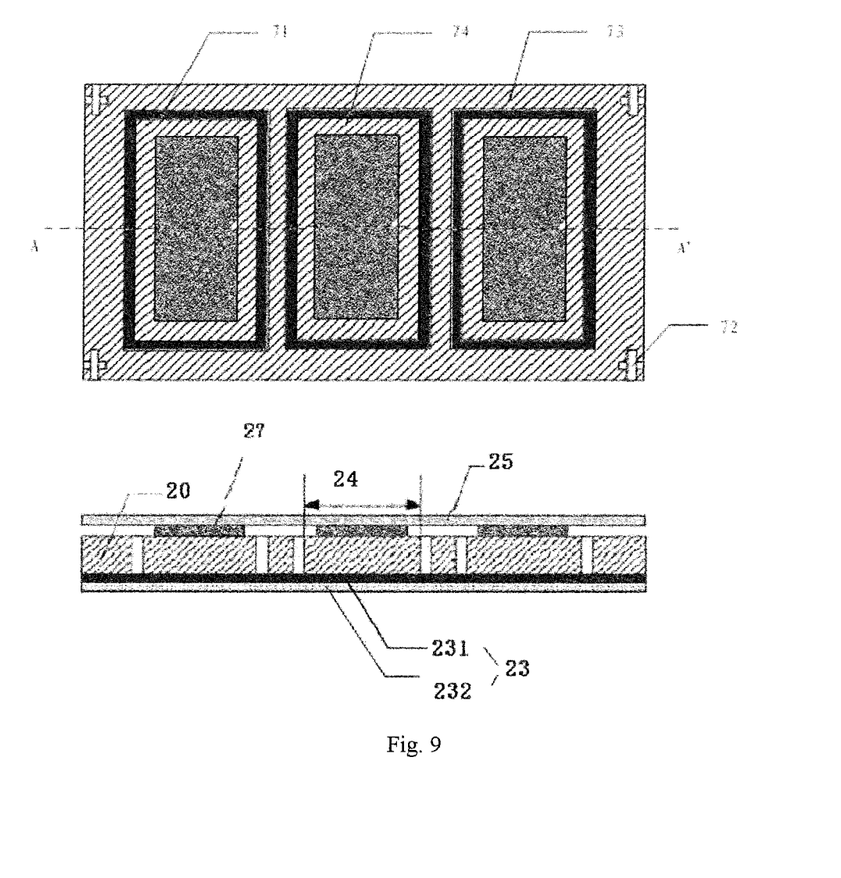
FIG. 9 shows a schematic diagram of an encapsulating thin film provided in an embodiment of this disclosure.

In an embodiment of this disclosure, with reference to the lower panel of FIG. 9, there is shown an encapsulating thin film, comprising:

a protective film 23;

a plurality of discrete metal film units 24 on the protective film; and an adhesive layer 27 on each of the metal film units.

Optionally, a peelable release film 25 is further comprised on the adhesive layer 27.

Optionally, the protective film comprises a base material layer 231 and a colloid layer 232.

The metal film units 24 are all formed from a metal film 20 in the same layer.

The material of the metal film unit is a metal or an alloy. It may be an invar film, a NiFe alloy, SUS stainless steel, or one or more materials of Ni, Fe, and Co.

The protective film may comprise a base material layer and a colloid layer. This protective film may be adhered to the metal film unit by the colloid layer. The protective film in this disclosure serves to protect the surface of metal on the one hand, and serves to connected metal film units together on the other hand.

Of course, the protective film may also exclude the colloid layer. The protective film may be bonded to the metal film unit in a manner of hot press, or the like. The manner of bonding is not limited in this disclosure.

The base material layer may be selected from any one of polypropylene terephthalate, polypropylene, polyethylene, oriented polypropylene, and polyvinyl chloride, and the colloid layer may be selected from any one of acrylate, silica gel, polyurethane, and rubber.

The adhesion between the protective film and the metal film unit may be 5 g/25 mm or more.

Typically, compared to metal, an organic film used as the protective film to connect the metal film units is more easily disconnected. Therefore, the metal film units may be easily separated by disconnecting the protective film between the metal film units, for example, disconnecting through cutting.

The protective film may be removed at an appropriate time, for example, before the display panel is used. That is to say, the protective film may be separated from the metal film units, after the display panel is encapsulated. It is possible to disconnect the protective film and then separated the protective film from each display panel. It is also possible to separate the whole protective film directly, to obtain a plurality of encapsulated display panels. After the protective film is removed, the colloidal layer possibly remained on the metal film unit may be cleaned off.

The metal film unit may have a larger area compared to the adhesive layer thereon.

The adhesive may adhere a metal film unit to a conventional display device to be encapsulated so as to perform encapsulation. The adhesive may be selected from any one of polyvinyl acetate, polyvinyl alcohol, polyvinyl formal, polypropylene, polyethylene, polyvinyl chloride, polyurethane, polyamide, saturated polyester, urea resin, phenolic resin, resorcinol resin, melamine resin, epoxy resin, unsaturated polyester, polyisocyanate, and furan resin, and has a thickness of 30-80 μm.

The release film may be peeled off the adhesive layer and is used to protect the adhesive layer from pollution before use. The material thereof may be selected from any one of polypropylene terephthalate, polypropylene, polyethylene, oriented polypropylene, and polyvinyl chloride.

When a release layer is present, the encapsulating thin film may be a coiled material and is thus easy for storage and transportation. The encapsulating thin film may also exclude the release film. For example, it may be directly used in encapsulation after an adhesive layer is applied.

The encapsulating thin film of this disclosure may be used in various devices which may be encapsulated with metal thin films. Sometimes, illustrations are made hereinafter by taking an OLED display panel as an example. However, it is to be understood that the scope of this disclosure is not limited thereto.

Figure 1:
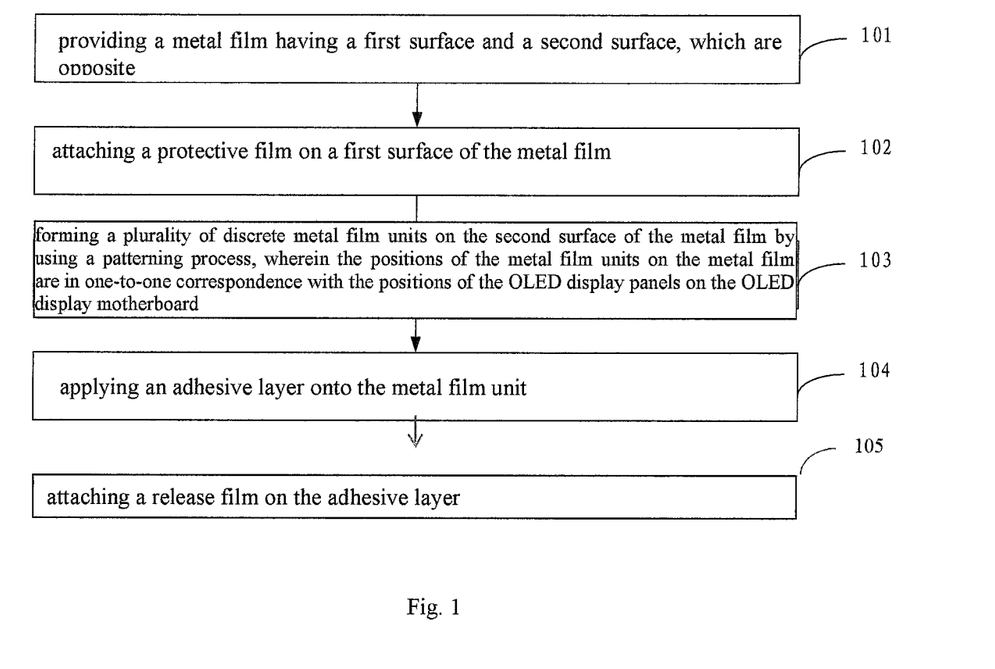
FIG. 1 shows a flow chart of steps of a production method of an encapsulating thin film provided in an embodiment of this disclosure.
Figure 2:
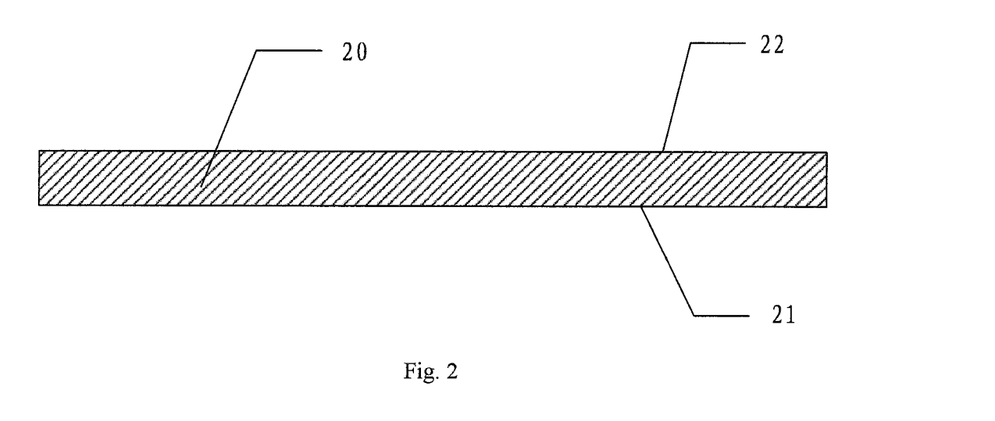
FIG. 2 shows a schematic diagram of a sectional structure of a metal film provided in a production method of an encapsulating thin film provided in an embodiment of this disclosure.

In an embodiment of this disclosure, with reference to FIG. 1, there is shown a production method of an encapsulating thin film for encapsulating an OLED display panel, and this production method may comprise:

Step 101: providing a metal film 20 having a first surface 21 and a second surface 22, which are opposite, with reference to FIG. 2.

Particularly, a raw material may be subjected to cold rolling treatment by using a multi-roll cold rolling mill to form a metal film coiled material having a thickness of 30-200 μm and a width of 300 mm-1200 mm. The raw material may be an invar film, or a NiFe alloy, SUS stainless steel, or one or more materials of Ni, Fe, and Co may also be used. In practical applications, the metal film coiled material may be cut according to the size of an OLED display motherboard to obtain a metal film 20. The metal film coiled material or the metal film is required to be subjected to oil removal cleaning, drying, and the like, before subsequent process steps.

Figure 3:
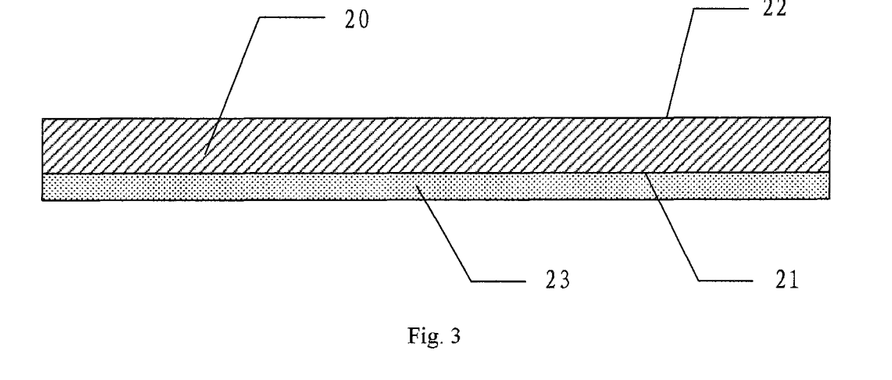
FIG. 3 shows a schematic diagram of a sectional structure of accomplishing the attachment of a protective film on a first surface of a metal film in a production method of a encapsulating thin film provided in an embodiment of this disclosure.

Step 102: attaching a protective film 23 on a first surface 21 of the metal film 20, with reference to FIG. 3.

Particularly, the first surface 21 of the metal film 20 after cleaning and drying is subjected to single-surface attachment of the protective film 23. The base material of the protective film 23 may be any one of polypropylene terephthalate, polypropylene, polyethylene, O-polypropylene, and polyvinyl chloride, and the colloid of the protective film 23 may be any one of acrylate, silica gel, polyurethane, and rubber. The adhesion of the protective film 23 is 5-100 g/25 mm, the thickness of the protective film 23 is 20-200 μm, and the width of the protective film 23 is the same as that of the metal film 20.

Figure 4:
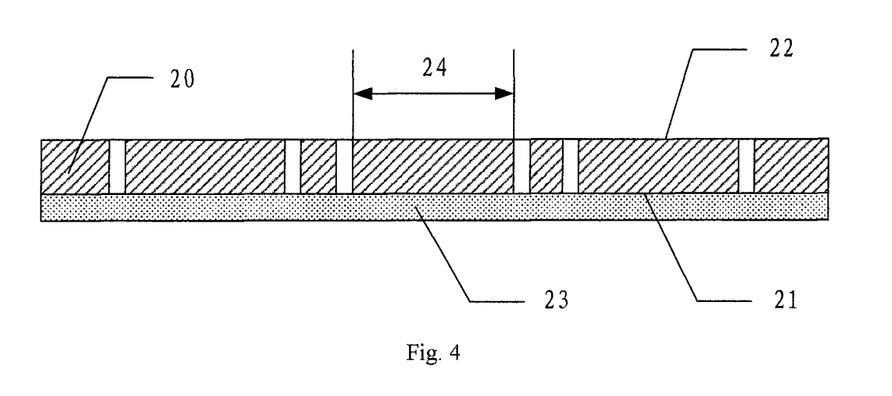
FIG. 4 shows a schematic diagram of a sectional structure of accomplishing a patterning process on a second surface of a metal film in a production method of a encapsulating thin film provided in an embodiment of this disclosure.

Step 103: forming a plurality of discrete metal film units 24 on the second surface 22 of the metal film 20 by using a patterning process, wherein the positions of the metal film units 24 on the metal film 20 are in one-to-one correspondence with the positions of the OLED display panels on the OLED display motherboard, with reference to FIG. 4.

In an implementation, a series of patterning processes such as photoresist coating, exposure, development, and etching may be used to treat the second surface 22 of the metal film 20 described above to form a plurality of discrete metal film units 24 corresponding to the positions of the OLED display panels on the OLED display motherboard. In practical applications, where the size of the metal film 20 is maintained to be unchanged, the specifications of the metal film units 24 may be designed according to the specifications of display panels to be attached.

Figure 5:
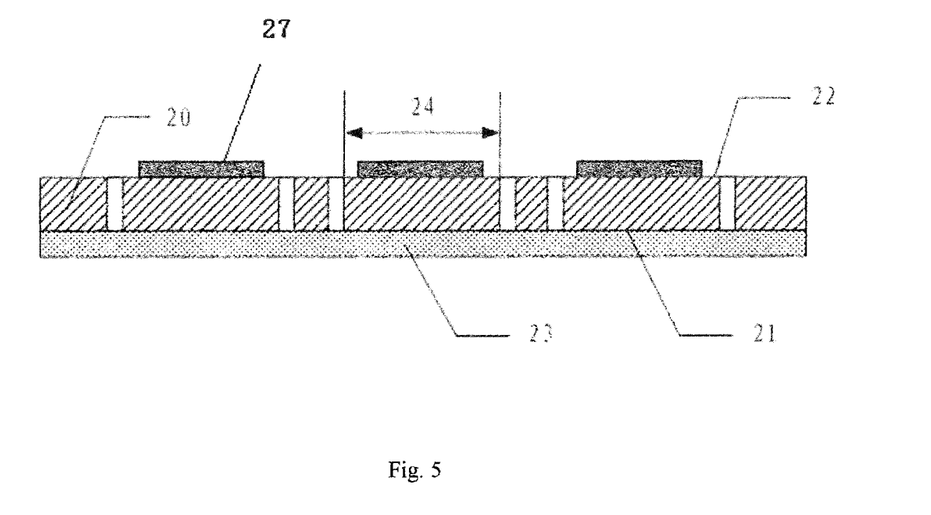
FIG. 5 shows a schematic diagram of a sectional structure of applying an adhesive onto a metal film unit in a production method of an encapsulating thin film provided in an embodiment of this disclosure.

Step 104: applying an adhesive layer 27 onto the metal film unit 24, with reference to FIG. 5.

Particularly, an adhesive may be coated on a side of the metal film 20, which has been subjected to the treatment of a patterning process, by using a process of screen printing, drying, or the like, wherein the distance between the border of the adhesive and the border of the metal film 20 is approximately 0.1-1.5 mm. That is, the border of the adhesive is indented by 0.1-1.5 mm with respect to the border of the metal film 20. The type of the adhesive is any one of polyvinyl acetate, polyvinyl alcohol, polyvinyl formal, polypropylene, polyethylene, polyvinyl chloride, polyurethane, polyamide, saturated polyester, urea resin, phenolic resin, resorcinol resin, melamine resin, epoxy resin, unsaturated polyester, polyisocyanate, and furan resin, and the adhesive has a thickness of 30-80 μm.

Figure 6:
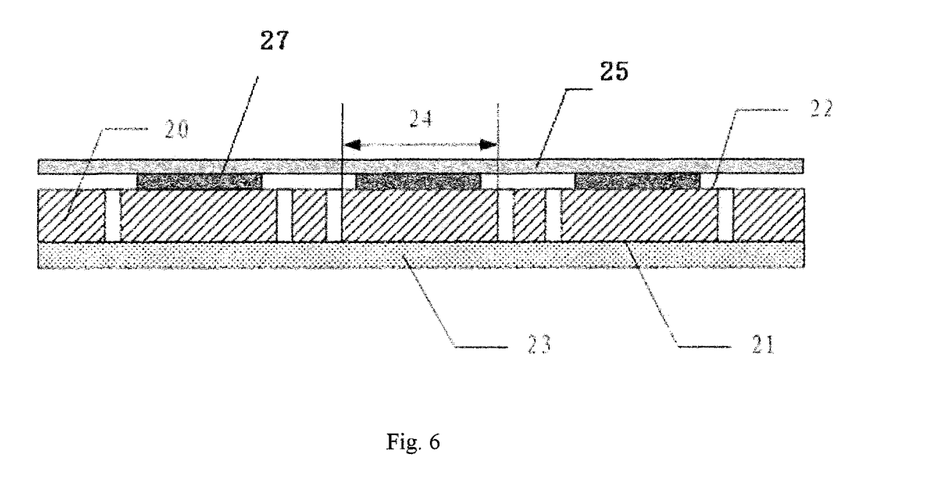
FIG. 6 shows a schematic diagram of a sectional structure of accomplishing the attachment of a release film on a second surface of a metal film in a production method of a encapsulating thin film provided in an embodiment of this disclosure.

Step 105: attaching a release film 25 on the adhesive layer 27, with reference to FIG. 6.

After the adhesive is formed, a release film 25 optionally is attached on the surface thereof. The base material of the release film 25 may be any one of polypropylene terephthalate, polypropylene, polyethylene, O-polypropylene, and polyvinyl chloride. In a practical process, the metal film 20 may also be subjected to steps of cleaning, drying, and the like as needed, before the adhesive is coated.

Additionally, the metal film coiled material may be cut to obtain a single sheet of metal film before subsequent processes such as protective film attachment, patterning process, release film attachment, and the like, or the metal film coiled material may be subjected to processes such as protective film attachment, patterning process, release film attachment, and the like before cutting of a single sheet of metal film. Specific steps may be determined according to practical situations, and are not limited in this disclosure.

With respect to the encapsulating thin film obtained by the production method of the encapsulating thin film provided in this embodiment, since a plurality of discrete metal film units are comprised, an attaching apparatus may encapsulate a plurality of panels simultaneously in practical processes so as to improve the production efficiency; and additionally, where the size of the encapsulating thin film is unchanged, the metal film units comprised therein may have various sizes so that an attaching apparatus may correspond to the encapsulation of panels having various sizes, thereby reducing the investment cost of apparatuses.

Figure 7:
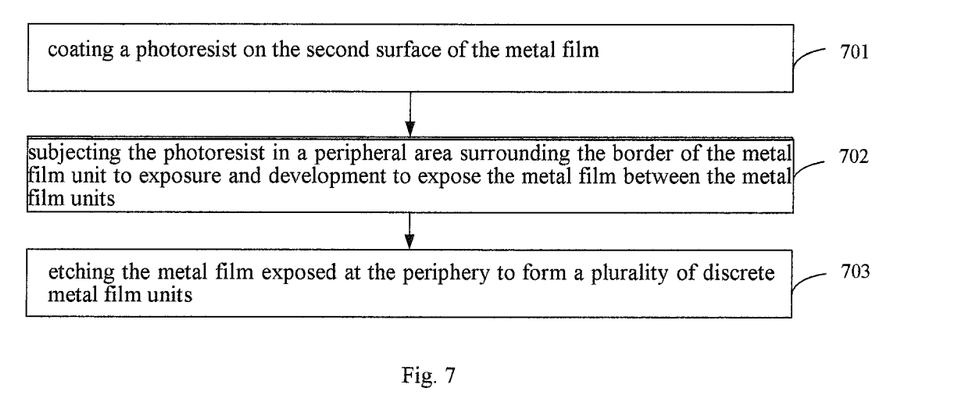
FIG. 7 shows a flow chart of steps of a patterning process in a production method of an encapsulating thin film provided in an embodiment of this disclosure.

In another embodiment provided by this disclosure, with reference to FIG. 7, there is shown a flow chart of steps of a patterning process in Step 103 described above, which may comprise:

Step 701: coating a photoresist on the second surface 22 of the metal film 20.

Particularly, a second surface 22 opposite to the protective film 20 is overlaid with a layer of photoresist after the protective film 23 is attached onto the first surface 21 of the metal film 20. Here, a positive photoresist or a negative photoresist may be used as the photoresist. In practical applications, this is specifically determined in conjunction with the types of exposure processes and of mask plates, and is not limited in this disclosure.

Step 702: subjecting the photoresist in a peripheral area surrounding the border of the metal film unit 24 to exposure and development to expose the metal film between the metal film units.

In an implementation, where the photoresist is a positive photoresist, a mask plate having a pattern of a slot may be used to subject the photoresist in a peripheral area surrounding the border of the metal film unit 24 to exposure and development to expose the peripheral area of the metal film unit 24, so as to perform subsequent etching treatment, to form discrete metal film units. Here, the width of the slot on the mask plate may be 30-1000 μm. The mask plate may have a hole. This hole may be used to form an alignment mark hole in a region of the metal film where there is no metal unit (e.g. the four corners of the metal film 20). The size of the hole may be 250-1000 μm. In practical applications, the width of the slot and the size of the hole may be specifically determined according to factors such as the size of the panel, and the like, and are not limited in this disclosure.

Step 703: etching the metal film 20 exposed at the periphery to form a plurality of discrete metal film units 24.

Figure 8:
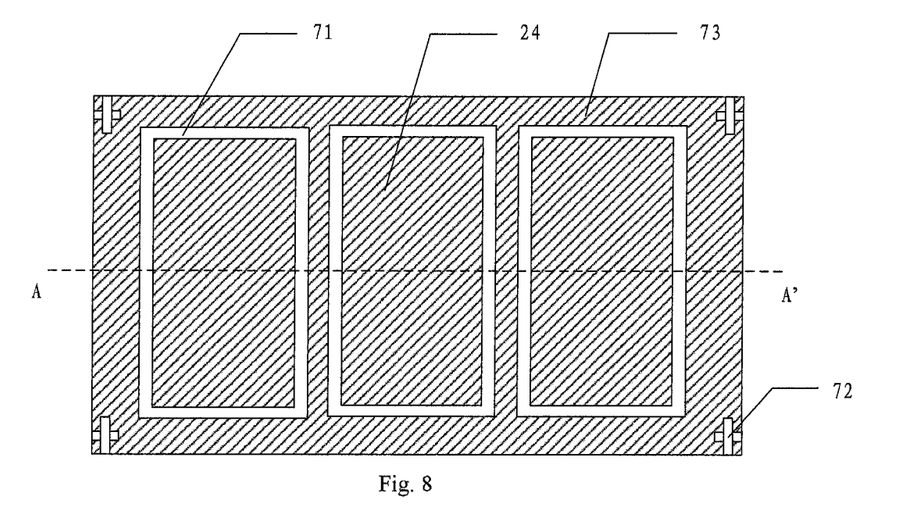
FIG. 8 shows a schematic diagram of a planar structure of accomplishing a patterning process on a second surface of a metal film in a production method of a encapsulating thin film provided in an embodiment of this disclosure.

In practical processes, the metal film 20 exposed at the periphery after exposure and development is etched with an etching liquid, by using the photoresist remaining after development as a mask. With reference to FIG. 8, it is shown that a seam 71 having a corresponding width is formed in the periphery of the metal film unit 24 so as to form a plurality of discrete metal film units 24. Here, the size of the seam 71 corresponds to the size of the slot on the mask plate. The protective film 23 of the first surface 21 of the metal film 20 may protect the discrete metal film units 24 from peeling-off. The schematic diagram of the sectional structure along the AA' direction in FIG. 8 is as shown in FIG. 4.

In another embodiment of this disclosure, there is provided another production method of an encapsulating thin film, which may further comprise before Step 104 described above:

forming an alignment mark 72 on the second surface 22 of the metal film 20 by a patterning process, wherein the position of the alignment mark 72 on the metal film 20 corresponds to the position of the alignment mark on the OLED display motherboard.

In practical processes, by producing a corresponding alignment mark pattern (e.g. the hole mentioned above) on a mask plate and a series of subsequent processes of exposure, development, and etching, an alignment mark 72 may be formed on the metal film 20. That is, the alignment mark 72 may be synchronously formed with the discrete metal film units 24 described above. The alignment mark 72 is mainly used in the alignment when the encapsulating thin film is encapsulated onto the OLED display panel on the OLED display motherboard, to prevent the performance of devices from being affected by the dislocation between the metal film unit and the display panel. It is required that the position of the alignment mark 72 on the metal film 20 corresponds to the position of the alignment mark on the OLED display motherboard and that the shapes and the sizes of both of them are matched. FIG. 8 shows that the alignment marks 72 are at four corners of the metal film 20. In practical applications, they may be located at other positions of the metal film 20, for example, at intermediate positions of four borders, as long as the precise alignment of both of them can be achieved. The position of the alignment mark 72 is not specifically limited in this disclosure. Additionally, in Step 104 described above, the precise alignment to the screen may also be achieved by using the alignment mark 72 on the metal film 20 in the process coating the adhesive by screen printing.

In another embodiment of this disclosure, there is further provided an encapsulating thin film used for encapsulating an OLED display panel. With reference to FIG. 6, this encapsulating thin film may comprise:

a metal film 20 having a first surface 21 and a second surface 22, which are opposite, where the metal film 20 comprises a plurality of discrete metal film units 24, and the positions of the metal film units 24 on the metal film 20 are in one-to-one correspondence with the positions of the OLED display panels on the OLED display motherboard; a protective film 23 attached on a first surface 21 of the metal film 20; and a release film 25 attached on a second surface 22 of the metal film 20.

Here, the material of the metal film may be an invar film, a NiFe alloy, SUS stainless steel, or one or more materials of Ni, Fe, and Co.

With reference to FIG. 8, the metal film 20 may further comprise a metal film matrix 73 surrounding the metal film units 24, and there is a seam between the metal film matrix 73 and the metal film unit 24, wherein the width of the seam may be 30-1000 μm. There may be a circular hole in the metal film matrix. The size of the circular hole may be 250-1000 μm. As shown in FIG. 8, there is a seam 71 between the metal film matrix 73 and the metal film unit 24, and the alignment mark 72 is located on the metal film matrix 73.

In another embodiment of this disclosure, there is provided a method for encapsulating a display panel by using the encapsulating thin film described above, comprising:

providing an array of a plurality of display panels to be encapsulated;

providing the encapsulating thin film described above, wherein an array of the plurality of discrete metal film units corresponds to the array of the plurality of display panels to be encapsulated;

aligning the plurality of discrete metal film units with the plurality of display panels to be encapsulated, respectively;

adhering the plurality of discrete metal film units to the plurality of display panels to be encapsulated by the adhesive layer, respectively, to encapsulate the plurality of display panels to be encapsulated; and separating the protective film from the metal film units.

The protective film between the metal film units may be disconnected, to obtain a plurality of display panels. The method for disconnecting the protective film may be, for example, cutting, or the like. Compared to cutting a metal film, the difficulty in cutting a protective film is much lower, so that the simultaneous production of a plurality of display panels may be easily achieved.

The array of the plurality of display panels to be encapsulated may be formed on a motherboard, and the method further comprises: separating the plurality of display panels to be encapsulated from the motherboard after encapsulating the plurality of display panels to be encapsulated to obtain a plurality of display panels. The motherboard may be, for example, the same base substrate for various display panels.

In another embodiment of this disclosure, there is provided an OLED display apparatus, comprising an OLED display panel formed by encapsulation using the encapsulating thin film of any one of embodiments described above.

In the process of the attachment of the display panel described above, the second surface 22 of the metal film 20 in the encapsulating thin film is attached to the OLED display panel by the adhesive so as to achieve the encapsulation of the OLED display panel.

This disclosure provides an encapsulating thin film, a production method thereof, and an OLED display apparatus. In this production method, a plurality of discrete metal film units are formed from a metal film attached on a protective film by a patterning process, the positions of the metal film units on the metal film are in one-to-one correspondence with the positions of the OLED display panels on the OLED display motherboard, and a release film is then attached on an adhesive layer at a side opposite to the protective film; with respect to the encapsulating thin film obtained by using this production method, since a plurality of discrete metal film units are comprised, an attaching apparatus may encapsulate a plurality of panels simultaneously in practical processes so as to improve the production efficiency; and additionally, where the size of the encapsulating thin film is unchanged, the metal film units comprised therein may have various sizes so that an attaching apparatus may correspond to the encapsulation of panels having various sizes, thereby reducing the investment cost of apparatuses.

Various embodiments in this specification are all described in a progressive manner. Each of the embodiments emphatically illustrates those different from other embodiments, and the same or similar parts between embodiments can be referred to each other.

Finally, it is to be further indicated that relational terms such as first, second, and the like are merely to distinguish one entity or operation from another entity or operation, and it does not necessarily require or imply that there is any actual relation or order between these entities and operations. Additionally, terms "include", "comprise", or any other variant, intends to cover nonexclusive inclusion, such that a process, method, merchandise, or device comprising a range of elements comprises not only those elements, but also other elements which are not specifically listed or elements intrinsically possessed by this process, method, merchandise, or device. In absence of more limitations, an element defined by a sentence "comprise a" does not exclude that there is additionally the same element in a process, method, merchandise, or device comprising this element.

An encapsulating thin film, a production method thereof, and an OLED display apparatus provided by this disclosure are introduced in detail above. Principles and embodiments of this disclosure are elaborated herein by using specific embodiments, and the description of the above embodiments is only used to help the understanding of the method of this disclosure and the core idea thereof. At the meanwhile, with respect to those of ordinary skill in the art, modifications will be made to specific embodiments and application ranges according to the idea of this disclosure. In summary, the contents of this specification should not be construed as limiting this disclosure.

What is claimed is:

1. An encapsulating thin film for encapsulating a plurality of discrete OLED display panels on a motherboard, comprising:
   a temporary protective film comprising a base material layer and a colloid layer;
   a plurality of discrete metal film units on colloid layer of the temporary protective film, wherein each of the metal film units is for encapsulating one OLED display panel, and positions of the plurality of discrete metal film units are in one-to-one correspondence with positions of the OLED display panels on the motherboard; and
   an adhesive layer on each of the metal film units,
   wherein the metal film unit has a larger area compared to the adhesive layer thereon, and a distance between a border of the adhesive layer and a border of a metal film unit is approximately 0.1-1.5 mm,
   wherein
   a metal film having a first alignment mark is on the colloid layer of the temporary protective film, wherein the metal film having a first alignment mark does not belong to the plurality of discrete metal film units,
   the motherboard has a second alignment mark, and
   when the second alignment mark aligns with the first alignment mark, positions of the plurality of discrete metal film units are in one-to-one correspondence with position of the OLED display panels on the motherboard.

2. The encapsulating thin film according to claim 1, further comprising:
   a peelable release film on the adhesive layer.

3. The encapsulating thin film according to claim 1, wherein the material of the metal film unit is an invar film, a NiFe alloy, SUS stainless steel, or one or more materials of Ni, Fe, and Co.

4. The encapsulating thin film according to claim 1, wherein the base material layer is selected from any one of polypropylene terephthalate, polypropylene, polyethylene, oriented polypropylene, and polyvinyl chloride, and the colloid layer is selected from any one of acrylate, silica gel, polyurethane, and rubber.

5. The encapsulating thin film according to claim 1, wherein the adhesion between the temporary protective film and the metal film unit is 5 g/25 mm or more.

6. The encapsulating thin film according to claim 1, wherein the adhesive is selected from any one of polyvinyl acetate, polyvinyl alcohol, polyvinyl formal, polypropylene, polyethylene, polyvinyl chloride, polyurethane, polyamide, saturated polyester, urea resin, phenolic resin, resorcinol resin, melamine resin, epoxy resin, unsaturated polyester, polyisocyanate, and furan resin, and has a thickness of 30-80 sm.

7. The encapsulating thin film according to claim 2, wherein the material of the release film is selected from any one of polypropylene terephthalate, polypropylene, polyethylene, oriented polypropylene, and polyvinyl chloride.

8. The encapsulating thin film according to claim 2, wherein the encapsulating thin film is a coiled material.

9. A production method of the encapsulating thin film of claim 1, comprising:
   providing a metal film having a first surface and a second surface, which are opposite;
   bonding the protective film to the first surface of the metal film;
   forming the plurality of discrete metal film units by using a patterning process at the second surface of the metal film; and
   applying the adhesive layer onto the metal film unit.

10. The production method according to claim further comprising:
    attaching the release film on the adhesive layer.

11. The production method according to claim 9, wherein the patterning process comprises:
    coating a photoresist on the second surface of the metal film;
    subjecting the photoresist to exposure and development to expose the metal film between the metal film units; and
    etching the exposed metal film to form the plurality of discrete metal film units.

12. The production method according to claim 9, further comprising:
    forming an alignment mark in the metal film by the patterning process.

13. A method for encapsulating a display panel by using the encapsulating thin film of claim 1, comprising:
    providing an array of a plurality of display panels to be encapsulated;
    providing the encapsulating thin film of claim 1, wherein an array of the plurality of discrete metal film units corresponds to the array of the plurality of display panels to be encapsulated;
    aligning the plurality of discrete metal film units with the plurality of display panels to be encapsulated, respectively;
    adhering the plurality of discrete metal film units to the plurality of display panels to be encapsulated by the adhesive layer, respectively, to encapsulate the plurality of display panels to be encapsulated; and
    separating the protective film from the metal film units.

14. The method according to claim 13, wherein
    the array of the plurality of display panels to be encapsulated is formed on a motherboard, and the method further comprises:
    separating the plurality of display panels to be encapsulated from the motherboard after encapsulating the plurality of display panels to be encapsulated, to obtain a plurality of display panels.

* * * * *